United States Patent [19]

Tischer et al.

[11] 4,176,281

[45] Nov. 27, 1979

[54] METHOD FOR ADJUSTING A SEMICONDUCTOR DISK RELATIVE TO A RADIATION MASK IN X-RAY PHOTOLITHOGRAPHY

[75] Inventors: Peter Tischer, Strasslach; Eckart Hundt, Haar, both of Fed. Rep. of Germany

[73] Assignee: Siemens Aktiengesellschaft, Berlin & Munich, Fed. Rep. of Germany

[21] Appl. No.: 898,480

[22] Filed: Apr. 20, 1978

[30] Foreign Application Priority Data

May 20, 1977 [DE] Fed. Rep. of Germany ....... 2722958

[51] Int. Cl.$^2$ .................. A61K 27/02; G01M 21/00
[52] U.S. Cl. .................. 250/492 A; 250/272; 250/491
[58] Field of Search .............. 250/492 A, 491, 272

[56] References Cited

U.S. PATENT DOCUMENTS

| 3,742,229 | 6/1973 | Smith et al. ............ 250/492 A |
| 3,743,842 | 7/1973 | Smith et al. ............ 250/492 A |
| 3,745,358 | 7/1973 | Fritz et al. ............ 250/492 A |
| 4,085,329 | 4/1978 | McCoy et al. ............ 250/492 A |

OTHER PUBLICATIONS

"X-Ray Lithography—" by Spears & Smith, Solid State Technology, Jul. 1972, pp. 21–26.
"Mask Alignment—Lithography" by McCoy et al., Solid State Technology, Sep. 1976, pp. 59–64.

*Primary Examiner*—Harold A. Dixon
*Attorney, Agent, or Firm*—Hill, Van Santen, Steadman, Chiara & Simpson

[57] ABSTRACT

In the illustrative disclosure, alignment of x-ray masks, with elements in the submicron range for x-ray lithographic replication, is carried out with the use of through-bores in the set of masks and in the substrates. A single point x-ray source may be used to produce widely offset parallel beams defining the bore alignment axes, or the bores may be formed with oblique axes converging at a point, so as to be usable with diverging x-ray beams from a point x-ray source.

3 Claims, 2 Drawing Figures

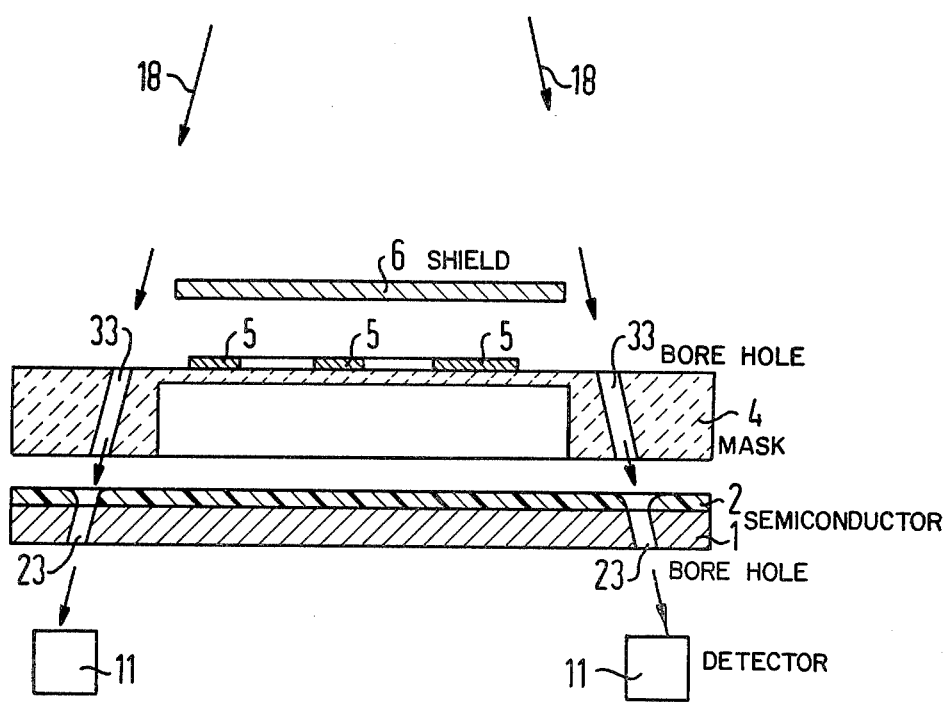

METHOD FOR ADJUSTING A SEMICONDUCTOR DISK RELATIVE TO A RADIATION MASK IN X-RAY PHOTOLITHOGRAPHY

BACKGROUND OF THE INVENTION

The invention relates to a method for adjusting a semiconductor disk relative to a radiation mask in x-ray photolithography as it is more precisely disclosed in the preamble of the main claim.

For the production of semiconductor components and integrated circuits in semiconductor technology photolithographic processes are carried out in which structures of a radiation mask are transmitted onto a radiation-sensitive lacquer layer on a semiconductor disk. During the total production processes it is necessary to bring coincidence to several layers of structures. For this reason the semiconductor disk must be very precisely adjusted in relation to the respective mask in the various exposure steps. Thereby the error in the adjusting of the masks relative to the semiconductor disks must be smaller than the smallest structure to be produced in the semiconductor disk. In the present production method for integrated circuits the structure transfer most often proceeds light-optically. The adjustment is carried out by simultaneous observation of two pairs of adjusting marks, whereby the one pair of adjusting marks is situated on the mask and the other pair is situated on the semiconductor disk. The observation is normally carried out light-optically with an adjusting microscope. However, for very precise adjustments in the range of one-half micron (0.5 $\mu$m) the limits of the depth of focus of conventional light-optical microscopes is attained.

X-ray photolithography utilizes a lacquer sensitive to x-radiation and also utilizes x-radiation for reproducing the mask. Due to the short wavelength, diffraction phenomena are decreased in this type of reproduction so that the structure dimensions which can be reproduced are considerably smaller than in a reproduction with visible light. For this reason an adjustment with a precision of approximately one-tenth micron (0.1 $\mu$m) has to be obtained in x-ray photolithography. As a so-called "proximity" copy is made in x-ray photolithography, in which a spacing, for example, of 50 $\mu$m is kept between the semiconductor disk and the exposure mask, the depth of focus of a light-optical microscope is generally not sufficient to simultaneously view the adjusting mark on the semiconductor disk and the adjusting mark on the exposure mask in focus. Additional difficulties can occur in an adjusting system utilized for x-ray photolithography in that the material of the carrier on which the structures of the exposure mask, used as adjusting marks, are situated are not, or are only very poorly, permeable to light so that—due to this circumstance—a simultaneous sharp in-focus adjustment of the adjusting microscope with respect to the adjusting marks of the mask and the adjusting marks of the semiconductor disk is impaired.

An adjusting method for x-ray photolithography is known from "Solid State Technology" (1972), pages 21-26, in which the adjustment proceeds with the aid of x-rays. Thereto adjusting marks consisting of x-ray absorbing material are applied to the semiconductor disk and also to the radiation mask. After the x-rays have penetrated these adjusting marks, the intensity of radiation is measured with the aid of a detector, and depending upon the design of the two adjusting marks, the parts are relatively adjusted for an indication of radiation maximum or radiation minimum by the detector. Thereby, however, difficulties occur as the adjusting marks must be relatively thick in order to absorb the radiation sufficiently. The radiation penetrating the adjusting marks results in a high background illumination and decreases the adjusting precision. An additional difficulty results therefrom that the semiconductor disk per se absorbs a lot of radiation and thus decreases the signal intensity in the detector. In order to avoid these problems, "Solid State Technology" (1972), pages 21 through 26 suggests to thinly etch the semiconductor disk in the area of the adjusting marks and also to thinly etch the radiation mask in the area of the adjusting marks and the reproducing structures which absorb the x-rays, so that a sufficient x-ray intensity is available for the adjustment. However, for the thin-etching of the semiconductor disk additional method steps are necessary such as, for example, a boron-doping with a depth of approximately 5 $\mu$m which takes care of the etch-stop and thus for an even thickness of the etched-off area during the thin-etching process. Aside from the fact that additional expense is necessary for the thin-etching, such semiconductor disks are sensitive to mechanical effects in the thin-etched areas such as, for example, jarrings occurring during the insertion into the exposure apparatus. The corresponding also holds true for the thin-etching of the exposure mask.

SUMMARY OF THE INVENTION

It is an object of the invention to disclose an adjusting process for utilization in x-ray photolithography, in which a thin-etching process of the semiconductor disks or the radiation masks is not necessary, and in which an adjustment precision of approximately 0.1 $\mu$m can be obtained.

This objective is inventively resolved in accordance with the characterizing portion of the main claim for a method disclosed in the preamble of this claim.

Preferred embodiments of the invention are disclosed in the subclaims.

An advantage of the inventive method is that in a silicon-semiconductor disk, conventionally possessing a thickness of approximately one-half millimeter (0.5 $\mu$mm) in the silicon-technology, said semiconductor disk absorbs x-rays very well. The same holds true for the conventionally utilized carriers for the radiation mask which consist of quartz glass approximately one millimeter (1 mm) thick. The holes in the mask and in the semiconductor disk therefore exhibit a considerably better contrast than can be obtained by other adjusting marks with simultaneous thin-etching of the carrier. In meeting a required adjustment precision of approximately 0.1 $\mu$m—in accordance with one embodiment of the invention—the size of the holes is selected at approximately 10 $\mu$m. These holes are advantageously bored into the semiconductor disk or into the radiation mask with the aid of a high-power laser. Of importance is the reciprocal position of these holes used as adjusting marks, which position must be maintained not only in all radiation mask which are required for the production of a circuit but also in all semiconductor disks on which these circuits are to be formed. In accordance with another embodiment of the invention—before further processing—the components are provided with holes, used as adjusting marks, with the aid of a single apparatus, particularly with one or two high-power lasers in a fixed assembly receiving the semiconductor disks and also the substrates of the radiation masks. During the production of the masking structures on the mask the position of the adjusting mark is firstly determined, for example, with the aid of an electron beam, and subsequently the pattern to be reproduced in the photolacquer is produced with the aid of the x-rays.

If the holes in the radiation mask and in the semiconductor disk, which are used as adjusting marks, are respectively situated perpendicularly to their adjoining surfaces, a precise adjustment can only be obtained when the x-radiation, utilized for the adjustment, impinges at a right angle. The point-shaped x-ray source normally utilized in x-ray lithography does not fulfill this requirement. Parallel x-ray beams can be obtained with two x-ray sources, correspondingly positioned and outfitted with corresponding beam shaping means. It is more expedient however to attach two diffraction crystals for x-radiation—in accordance with one embodiment of the invention—such that the radiation coming from the x-ray source is reflected at these crystals and thus two x-ray beams are formed, which perpendicularly impinge upon the semiconductor disk and upon the radiation mask. An alternative resolution thereto is to arrange the adjusting marks in the radiation mask and in the semiconductor disk such that the axes of these holes—in the adjusted correct condition—are directed toward the point-shaped x-ray source utilized for the adjustment. The production of such adjusting marks, for example, proceeds with the aid of two lasers which are arranged such that the axes of the beams, emerging from said lasers, conform with the axes of the x-ray beams for the intended location of the x-ray source. Thereby a relationship is formed between the location of the adjusting marks in the carrier of the radiation mask and also in the semiconductor disk, which relationship corresponds with the central projection for the radiation emerging from the point-shaped x-ray source.

It is additionally expedient to utilize x-radiation for the adjustment, whose wavelength is smaller than the x-radiation utilized for the exposure of the photolacquer. Thereby, due to the higher absorption of the semiconductor material for hard x-radiation, a higher contrast is obtained in the adjustment. The photolacquer, furthermore, is less sensitive to hard x-radiation so that an exposure of the photolacquer is avoided during the adjustment.

The invention is more specifically explained with the aid of sample embodiments illustrated on the accompanying sheets of drawings; and other objects, features and advantages will be apparent from this detailed disclosure and from the appended claims.

BRIEF DESCRIPTION OF THE DRAWINGS

FIG. 2 schematically illustrates an arrangement, in which diverging beams from a point-shaped x-radiation source are utilized for the adjustment.

DETAILED DESCRIPTION

Figure 1:
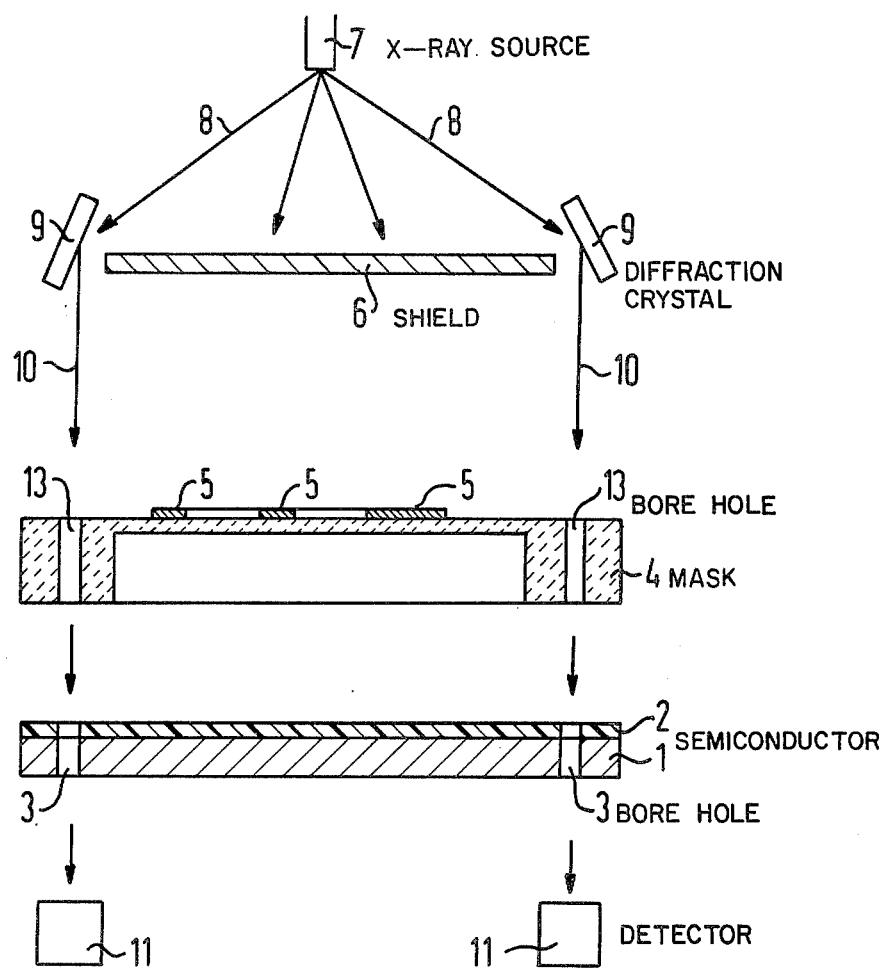
FIG. 1 schematically illustrates an arrangement in which the x-radiation, utilized for the adjustment, impinges vertically onto the surface of the radiation mask or of the semiconductor disk.

FIG. 1 schematically illustrates how an adjustment is undertaken with the aid of the inventive method. The semiconductor disk 1 is located in the exposure apparatus, said disk being provided with an x-ray sensitive photolacquer layer 2. With the orientation shown in FIG. 1, two bore holes 3 extend vertically through the semiconductor disk 1 and through the photolacquer layer 2, said bores having a diameter of ten microns (10 $\mu$m), for example. Over the semiconductor disk 1 the radiation mask is mounted which consists of a quartz or glass carrier 4, on which the structures 5 of x-ray absorbing material, for example of gold, are located. Bore holes 13 extend through the carrier 4, said bore holes being utilized as adjusting marks of the radiation mask. These adjusting marks 13 also have a diameter smaller than fifty microns (50 $\mu$m), preferably approximately ten microns (10 $\mu$m). Above the radiation mask a shield or screen 6 is located which is to prevent the photolacquer layer 2 on the semiconductor disk from being exposed during the adjustment. From the radiation 8 emerging from the x-ray source 7, two ray beams 10 are delineated with the aid of two diffraction crystals 9, such that the ray beams 10 are directed vertically in relation to the horizontally disposed surface of the radiation mask 4 and of the semiconductor disk 1. The semiconductor disk or the radiation mask, respectively, are displaced for the adjustment such that the detectors 11, situated under the bores 3, indicate a maximum intensity for the impinging radiation.

FIG. 2 illustrates an alternate embodiment of the inventive method, in which the adjustment results with the aid of a point-shaped x-ray source. Thereby bores 23 and 33 are used as adjusting marks of the semiconductor disk 1 and of the radiation mask 4, said bores being arranged such that their axes converge toward the point-shaped x-ray source in the correct position of semiconductor disk 1 and radiation mask 4. In that case, the detectors 11 show a maximum intensity for the x-ray beams 18 passing through.

It will be apparent that many modifications and variations may be effected without departing from the scope of the novel concepts and teachings of the present invention.

We claim as our invention:

1. A method for the adjustment of a semiconductor disk relative to a radiation mask in x-ray photolithography, in which the semiconductor disk and the radiation mask are provided with adjusting marks corresponding with one another, and whereby the adjustment results with the aid of x-radiation and with one or several detectors sensitive to x-rays, characterized in that bores are utilized as adjusting marks for the semiconductor disk and the radiation mask, said bores completely penetrating the semiconductor disk and the photolacquer layer situated on the semiconductor disk and the radiation mask, respectively, the axes of said bores extending perpendicularly in relation to the surface of the semiconductor disk and of the radiation mask, characterized in that the adjustment proceeds with the aid of a pair of perpendicular x-ray beams whose paths extend in parallel to one another and perpendicular to the surface of the semiconductor disk and of the radiation mask, and characterized in that a point-shaped x-ray source is utilized for the adjustment and that two parallel x-ray beams are produced with the aid of two diffraction crystals.

2. A method in accordance with claim 1, characterized in that the bores utilized as adjusting marks are bored into the semiconductor disk and into the radiation mask with the aid of a laser.

3. A method in accordance with claim 2, characterized in that simultaneously several bores are produced in the semiconductor disk and in the radiation mask with the aid of an arrangement of several lasers.

* * * * *